United States Patent
Nakajima

(10) Patent No.: US 6,919,771 B2
(45) Date of Patent: Jul. 19, 2005

(54) DIGITAL AMPLIFIER

(75) Inventor: Kouji Nakajima, Tokyo (JP)

(73) Assignee: Denon, Ltd., Tokyo (JP)

(*) Notice: Subject to any disclaimer, the term of this patent is extended or adjusted under 35 U.S.C. 154(b) by 110 days.

(21) Appl. No.: 10/669,374

(22) Filed: Sep. 25, 2003

(65) Prior Publication Data

US 2004/0130389 A1 Jul. 8, 2004

(30) Foreign Application Priority Data

Jan. 6, 2003 (JP) ........................................ 2003-000010

(51) Int. Cl.[7] ............................ H03K 7/08; H03F 3/38; G11B 20/10
(52) U.S. Cl. ......................... 332/109; 332/107; 330/10; 360/29
(58) Field of Search ................................. 332/106, 107, 332/109–111, 156; 330/10; 360/29; 375/238

(56) References Cited

U.S. PATENT DOCUMENTS

| 4,142,066 A | 2/1979 | Ahamed |
| 4,371,972 A | 2/1983 | Schwarz et al. |
| 4,812,815 A | 3/1989 | Miyakoshi et al. |
| 5,200,750 A | 4/1993 | Fushiki et al. |
| 5,682,162 A | 10/1997 | Hamasaki et al. |
| 5,986,498 A * | 11/1999 | Rodriguez ............... 330/10 |
| 6,392,476 B1 * | 5/2002 | Rodriguez ............... 330/10 |
| 6,683,494 B2 * | 1/2004 | Stanley .................... 330/10 |
| 2002/0001342 A1 | 1/2002 | Berkhout |

FOREIGN PATENT DOCUMENTS

JP    2001-292040    10/2001

* cited by examiner

*Primary Examiner*—David Mis
(74) *Attorney, Agent, or Firm*—Dickstein Shapiro Morin & Oshinsky LLP

(57) ABSTRACT

An object of the present invention is to provide a digital amplifier which is capable of preventing a reproduction of an analogue audio signal from a loud speaker, when an output sound volume from the loud speaker is set to zero and when inputting of a digital audio signal or an input signal is stopped. In order to achieve the object, in the digital amplifier of the present invention, a silent PWM signal output section 7 outputs a PWM signal having a duty ratio of 50%, instead of a PWM signal generated by the PWM signal generating section 6, in the following cases: the factor detecting section 3 detects that the digital audio signal is multiplied by the factor "0" in the gain regulation section 2, the silent signal determining section 4 determines that the signal input from the reproducing unit 13 is stopped, and the silent signal determining section 4 determines that the digital audio signal is a signal at a silent level.

3 Claims, 3 Drawing Sheets

DIGITAL AMPLIFIER

DESCRIPTION OF THE RELATED ART

The present invention relates to a digital amplifier employing PWM (Pulse Width Modulation) method, which generates a PWM signal based on an inputted audio signal and switches a switching power supply in response to the PWM signal.

A digital amplifier employing the PWM method is known as an amplifier having a higher power efficiency comparing to an analogue amplifier of earlier development. The digital amplifier generates a PWM signal from an inputted digital audio signal and carries out switching of a switching power supply in response to the PWM signal. A technique relating to this digital amplifier is described in Japanese patent application laid-open No. 2001-292040 (e.g., pages 2 to 3, FIG. 7).

FIG. 2 is a block diagram showing a digital amplifier employing the PWM method according to earlier development.

Into an input section 1, a digital audio signal is inputted, which has been outputted from a reproducing unit that reproduces audio data recorded on an information recording medium such as a compact disc (referred to as a "CD", hereinafter). The input section 1 inputs the digital audio signal into a gain regulation section 2. The gain regulation section 2 regulates the gain for the digital audio signal, and then, inputs the regulated digital audio signal into a digital filter 5. The digital audio signal is then subjected to a computing process, such as a tone control and a low frequency component separation, by the digital filter 5, and the processed digital audio signals are inputted into a PWM signal generating section 6. The PWM signal generating section 6 generates a PWM signal by sampling the digital audio signal based on a triangular wave generated within the digital amplifier, and inputs the generated PWM signal into a driving section 8. The driving section 8 controls a switching section 9 and carries out switching of the switching power supply in response to the PWM signal. Accordingly, a constant voltage pulse signal is generated, and it is inputted into a low pass filter 10 (referred to as "LPF", hereinafter). The LPF 10 filters out a high frequency component from the constant voltage pulse signal, and an analogue audio signal is demodulated from the constant voltage pulse signal. The analogue audio signal demodulated in the LPF 10 is inputted in an output section 11 and the output section 11 inputs the analogue audio signal in a loud speaker 12. Consequently, an audio signal is reproduced from the loud speaker 12.

FIG. 3 is an illustration to explain a relation between a level of an analogue audio signal and duty ratios of PWM signals.

The PWM signals shown in FIG. 3 are a PWM signal 30 having a duty ratio of 70%, a PWM signal 31 having a duty ratio of 50%, and a PWM signal 32 having a duty ratio of 20%. As shown in FIG. 3, the level of the analogue audio signal is represented by the duty ratios of the PWM signals. When the analogue audio signal is at a silent level, the duty ratio of the PWM signal is 50%.

Meanwhile, in the digital amplifier as shown in FIG. 2, when an output sound volume from the loud speaker 12 is set to zero, on an operation section, not illustrated, which is connected to the gain regulation section 2, an operation for the setting of zero for the output sound volume from the loud speaker 12 is performed. At this stage, the gain regulation section 2 multiplies the inputted digital audio signal by factor "zero", and converts the digital audio signal into a signal at the silent level. When this digital audio signal at the silent level is inputted in the PWM signal generating section 6, it generates a PWM signal of duty ratio 50%.

However, at the timing when the operation is performed to set the output sound volume from the loud speaker 12 to zero, a feedback circuit in the digital filter 5 has already started performing a computing process as to the digital audio signal, which has not been multiplied by factor zero. Here, the feedback circuit provided in the digital filter 5 comprises a delay device, a multiplier, an adder and the like. Therefore, even when a digital audio signal at the silent level is inputted in the digital filter 5, a digital audio signal at a non-silent level continues to be outputted. Consequently, in the digital amplifier as shown in FIG. 2, even after the operation to set the output sound volume from the loud speaker 12 to zero is performed, an audio signal continues to be reproduced from the loud speaker 12 for a while.

During the time when a digital audio signal is reproduced from a CD and the like by the reproducing unit such as a CD player, and the digital audio signal is inputted in the digital amplifier in FIG. 2, if there is performed an operation in a reproduction unit, such as stopping reproduction or pausing reproduction, inputting of the digital audio signal from the reproducing unit to the digital amplifier is stopped accordingly. At this stage, in the digital filter 5, according to the feedback circuit, a computing process as to a previously inputted digital audio signal is being performed. Therefore, even when the input of the digital audio signal from the reproducing unit is stopped, outputting of another digital audio signal continues.

Similarly, in the case where inputting of an input signal, (e.g., a digital audio signal, a control signal to control the digital amplifier and the like) from the reproducing unit to the digital amplifier is stopped, a digital audio signal continues to be outputted for a while, regardless of a halt of the digital audio signal input from the reproducing unit.

As described above, according to the digital amplifier as shown in FIG. 2, even after inputting of a digital audio signal or an input signal from the reproducing unit is stopped, an audio signal continues to be reproduced from the loud speaker 12 for a while.

SUMMARY OF THE INVENTION

A first object of the present invention is to provide a digital amplifier which is capable of preventing a reproduction of an analogue audio signal from a speaker, when an output sound volume from the speaker becomes zero. A second object is to provide a digital amplifier which is capable of preventing a reproduction of an analogue audio signal from a loud speaker, when inputting of a digital audio signal from the reproducing unit is stopped. Further, a third object is to provide a digital amplifier which is capable of preventing a reproduction of an analogue audio signal from a loud speaker, when a signal inputted from the reproducing unit is stopped.

In order to achieve the first object, according to the first aspect of the present invention, there is provided a digital amplifier comprising, a gain regulation means which regulates an gain for a digital audio signal, a PWM signal generating means which generates a PWM signal from the digital audio signal, the gain for which has been regulated by the gain regulation means, a switching means which switches a switching power supply in response to the PWM signal generated by the PWM signal generating means, a detecting means which detects the gain which has been regulated by the gain regulation means, and a silent PWM signal outputting means which outputs to the switching means a PWM signal having a duty ratio of 50%, instead of the PWM signal which has been generated by the PWM signal generating means, when the detecting means detects that the gain is zero.

In order to achieve the second object, according to the second aspect of the present invention, there is provided a digital amplifier, comprising, a determining means which determines a digital audio signal as a silent signal, when the digital audio signal includes a plurality of bits indicating a value within a predetermined range, and is inputted for a predetermined period of time, a PWM signal generating means which generates a PWM signal from the digital audio signal, a switching means which switches the switching power supply in response to the PWM signal generated by the PWM signal generating means, and a silent PWM signal outputting means which outputs to the switching means a PWM signal having a duty ratio of 50%, instead of the PWM signal which has been generated by the PWM signal generating means, when the determining means determines that the digital audio signal is the silent signal.

In order to achieve the third object, according to the third aspect of the present invention, there is provided a digital amplifier comprising, an input signal determining means which determines whether or not an input signal from the reproducing unit exists, a PWM signal generating means which generates a PWM signal from a digital audio signal included in the input signal, a switching means which switches the switching power supply in response to the PWM signal generated by the PWM signal generating means, and a silent PWM signal outputting means which outputs to the switching means a PWM signal having a duty ratio of 50%, instead of the PWM signal which has been generated by the PWM signal generating means, when the input signal determining means determines that the input signal does not exist.

DESCRIPTION OF THE PREFERRED EMBODIMENTS

Hereinafter, preferred embodiments of the present invention will be explained, with reference to the attached drawings.

Firstly, a configuration of the digital amplifier relating to the present embodiments will be described.

Figure 1:
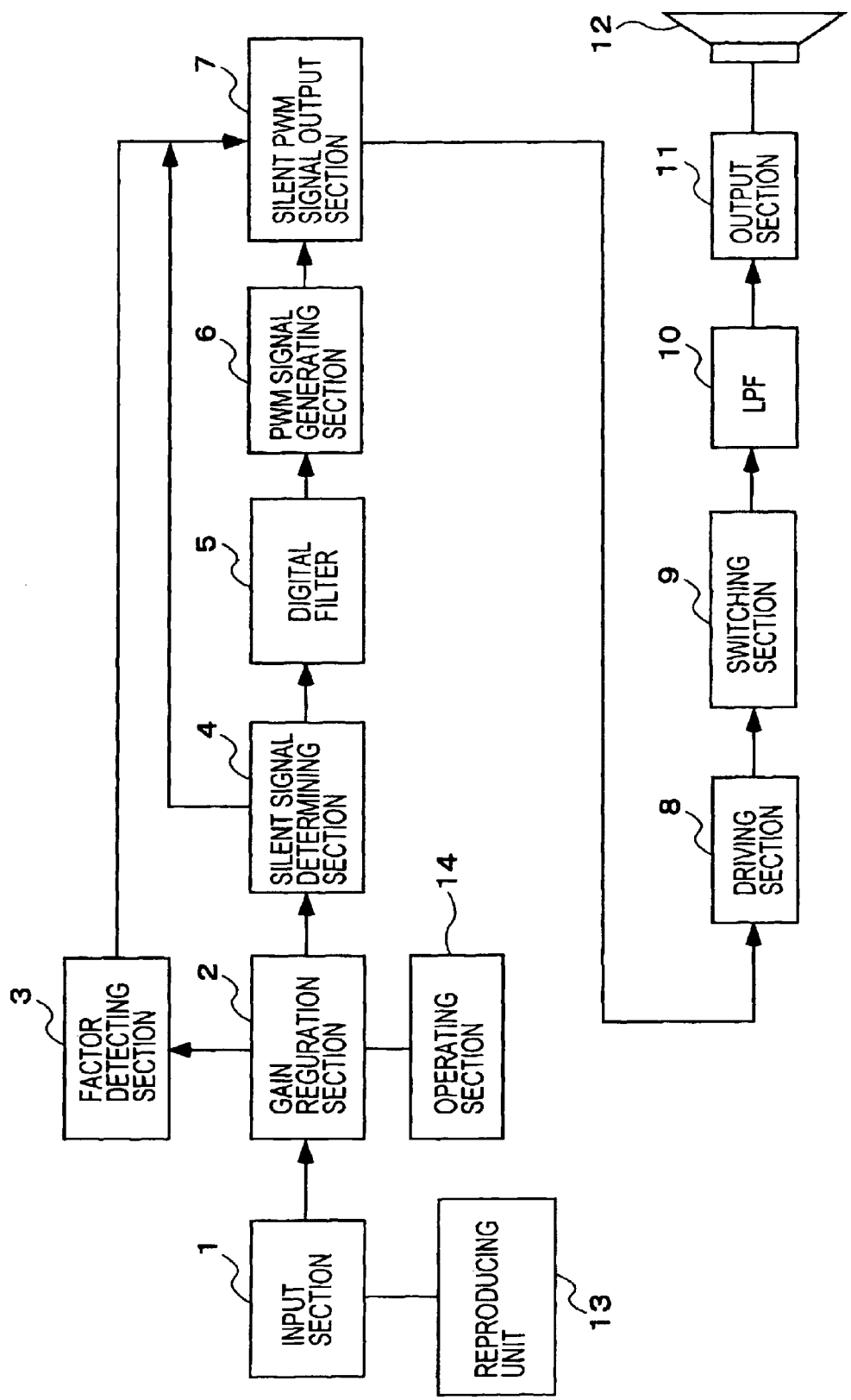
FIG. 1 is a diagram showing a configuration of a digital amplifier relating to the embodiments of the present invention.
Figure 2:
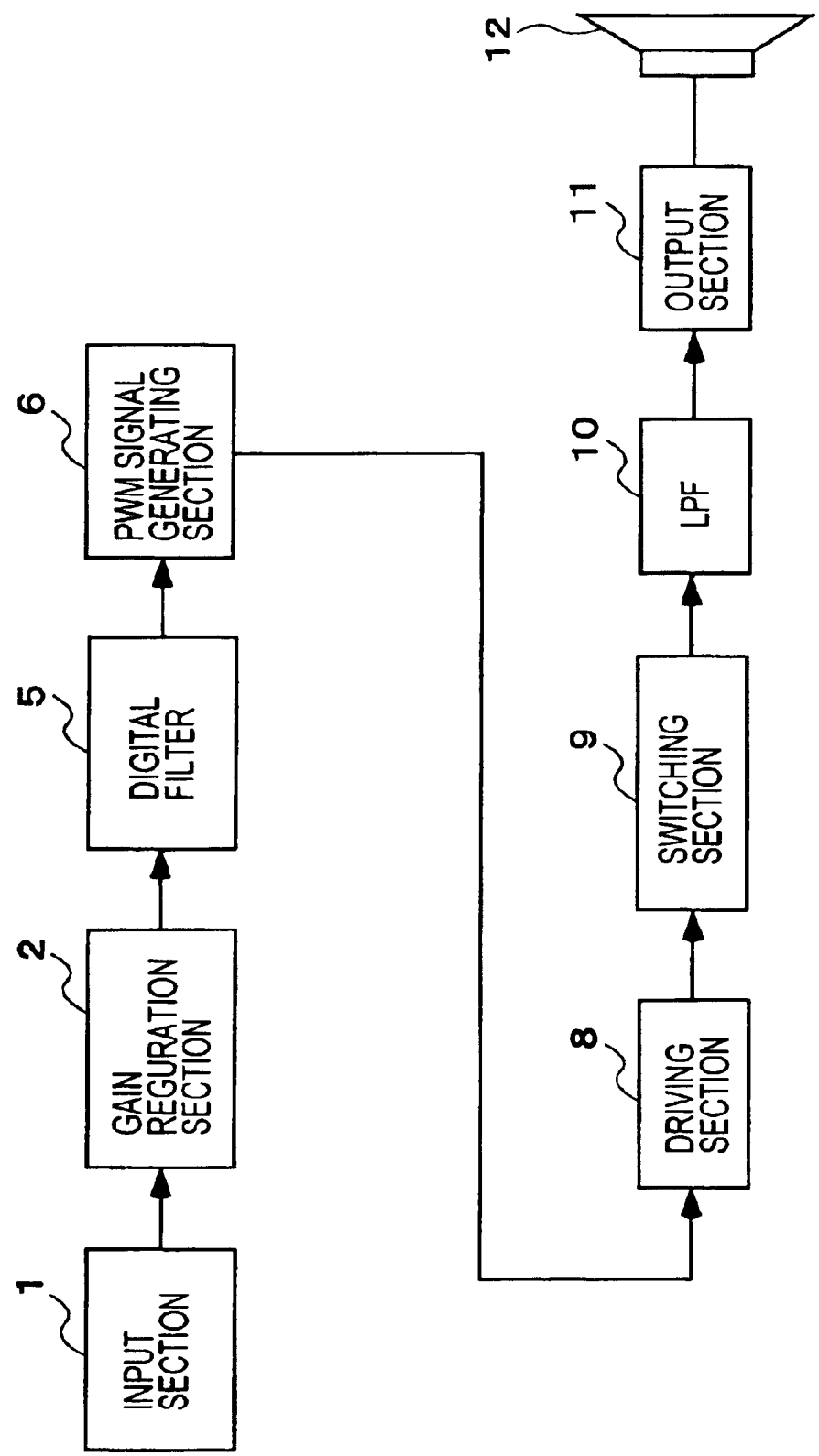
FIG. 2 is a diagram showing a configuration of a digital amplifier according to earlier development.

FIG. 1 is a block diagram showing a digital amplifier relating to the present embodiments.

The digital amplifier relating to the present embodiments has an input section 1, a gain regulation section 2, an operating section 14, a factor detecting section 3, a silent signal determining section 4, a digital filter 5, a PWM signal generating section 6, a silent PWM signal outputting section 7, a driving section 8, a switching section 9, an LPF 10, an output section 11. The reference number 13 indicates a reproducing unit which is connected to the input section 1, and the reference number 12 indicates a loud speaker which is connected to the output section 11.

This digital amplifier is connected to the reproducing unit 13, such as a CD player and a DVD (Digital Versatile Disc) player, by way of an optical digital cable and the like. The input section 1 is provided with a digital input terminal into which a digital audio signal is inputted from the reproducing unit 13, such as a CD player and a DVD player.

The gain regulation section 2 multiplies the digital audio signal from the input section 1, by a factor according to an output sound volume from the loud speaker 12. With this operation, the gain for the digital audio signal from the input section 1 is varied.

The factor detecting section 3 detects a factor by which the gain regulation section 2 multiplies the digital audio signal. When the factor is zero, the factor detecting section 3 outputs a control signal to the silent PWM signal output section 7.

The silent signal determining section 4 determines whether or not the digital audio signal inputted from the gain regulation section 2 is a silent level digital audio signal, and outputs a control signal to the silent PWM signal output section 7 according to the determination result. Specifically, the silent signal determining section 4 determines a digital audio signal is at a silent level, when the digital audio signal includes a string of bits indicating a value within a predetermined range and is inputted for a predetermined period of time from the gain regulation section 2. Then, the silent signal determining section 4 outputs a control signal to the silent PWM signal output section 7. In the digital audio signal of 24 bits, if the most significant bit is a sign bit, the digital audio signal indicating a bit value within a predetermined range corresponds to a digital audio signal indicating a bit value within a range from "0x00000F" to "0xFFFFF0". Here, "0x" is a symbol indicating that a numeric value subsequent to the "0x " is given in hexadecimal. The digital audio signal indicating a bit value within the range of "0x00000F" to "0xFFFFF0" corresponds to a sound at a level from −144 dB to −120 dB and it is defined as a silent level digital audio signal in the present embodiments.

The silent signal determining section 4 determines whether or not an input signal (e.g., digital audio signal, control signal and the like) is inputted from the reproducing unit, and consequently, when it is determined that the input signal from the reproducing unit does not exist, the silent signal determining section 4 outputs a control signal to the silent PWM signal output section 7.

In the present embodiment, the aforementioned "a predetermined period of time" corresponds, for example, to a time period when 1,024 samples are retrieved from the inputted digital audio signal. It is possible to express the "predetermined period of time" T by the following equation, $T=(1/fs) \times 1024$, where "fs" represents a sampling frequency of the inputted digital audio signal. Therefore, when the sampling frequency "fs" of the inputted digital audio signal is 44.1 kHz, the "predetermined period of time" T is nearly equal to 23 msec. Further, when the sampling frequency "fs" is 96 kHz, the "predetermined period of time" T is nearly equal to 11 msec, and when the sampling frequency "fs" is 192 kHz, the "predetermined period of time" T is nearly equal to 5 msec. As described, the "predetermined period of time" is decided according to the sampling frequency "fs" of the digital audio signal.

The digital filter 5 is an Infinite Impulse Response (IIR) type digital filter, comprising a delay device (not illustrated), a multiplier (not illustrated) and an adder (not illustrated) and the like. With the digital filter 5, the digital audio signal inputted from the silent signal determining section 4 is subjected to a computing process such as a tone control, filtering of a low frequency component and the like, and the processed digital audio signal is inputted in the PWM signal generating section 6.

The PWM signal generating section 6 comprises an oscillator (not illustrated) which generates a triangular wave, and a comparator (not illustrated) which generates a PWM signal by sampling the digital audio signal from the digital filter 5 by use of the triangular wave obtained from the oscillator. The PWM signal generated by the PWM signal generating section 6 is inputted into the silent PWM signal output section 7.

The silent PWM signal output section 7 switches the PWM signal inputted from the PWM signal generating section 6 to a PWM signal having a duty ratio of 50%, when a control signal is inputted from the factor detecting section 3 or the silent signal determining section 4, and inputs the switched signal in the driving section 8. When there is no control signal from the factor detecting section 3 or the silent signal determining section 4, the silent PWM signal output section 7 inputs the PWM signal inputted from the PWM signal generating section 6 into the driving section 8. Here, the silent PWM signal output section 7 may be configured by being provided with any of the followings, i.e., a correcting device which corrects the duty ratio of the PWM signal from the PWM signal generating section 6 to 50%, and an output device which stops the PWM signal from the PWM signal generating section 6, as well as outputting a PWM signal having the duty ratio of 50%.

Figure 3:
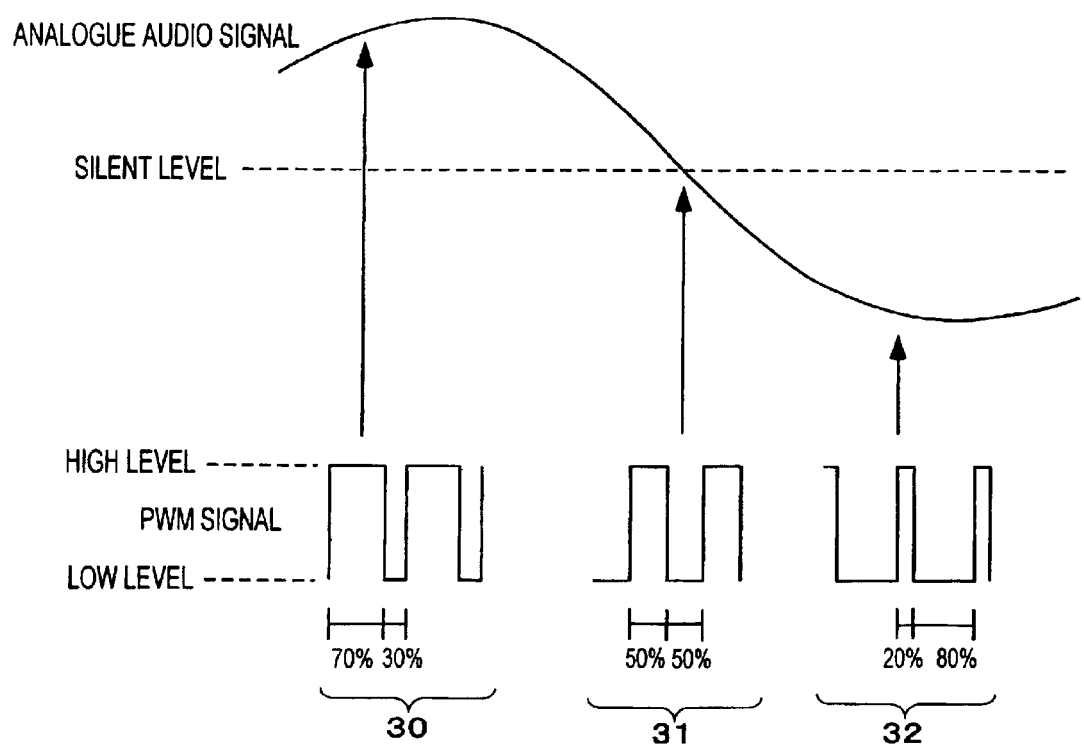
FIG. 3 is an illustration for explaining a relationship between a level of an analogue audio signal and duty ratios of PWM signals.

The driving section 8 controls the switching section 9 in response to the PWM signal from the silent PWM signal output section 7. Specifically, as shown in FIG. 3, when the inputted PWM signal is at high level, the switching section 9 is switched to "ON", whereas the switching section 9 is switched to "OFF", when the PWM signal is at low level.

The switching section 9 is configured by MOSFET (Metal-Oxide Semiconductor Field Effect Transistor) and the like. When this switching section 9 becomes in a state of "ON" according to a control by the driving section 8, the switching section 9 inputs a constant voltage pulse signal from a switching power supply (not illustrated) into the LPF 10.

The LPF 10 filters a high frequency component from the pulse signal inputted from the switching section 9, and demodulates into an analogue audio signal from the pulse signal. The analogue audio signal demodulated in the LPF 10 is inputted into the output section 11, and subsequently inputted into the loud speaker 12 from the output section 11. Accordingly, the analogue audio signal is reproduced from the loud speaker 12.

Next, an action of the digital amplifier relating to the present embodiments will be explained, in the case where an operation for the setting of zero for the output sound volume from the loud speaker 12 is performs on the operating section 14.

In the digital amplifier relating to the present embodiment, when the operating section 14 accepts an operation to set the output sound volume from the loud speaker 12 to zero, the gain regulation section 2 multiplies the digital audio signal from the input section 1 by the factor "zero". Accordingly, the digital audio signal is converted into a silent level digital audio signal. At this timing, the factor detecting section 3 detects that the factor by which the gain regulation section 2 multiplies the digital audio signal is zero, and inputs a control signal to the silent PWM signal output section 7.

When the control signal is inputted from the factor detecting section 3, the silent PWM signal output section 7 inputs a PWM signal having a duty ratio of 50% into the driving section 8. When the duty ratio of the PWM signal is 50%, an analogue audio signal is not reproduced from the loud speaker 12, and then, the output sound volume from the loud speaker 12 becomes zero.

On the other hand, when a control signal is not inputted from the factor detecting section 3, the silent PWM signal output section 7 outputs the PWM signal generated by the PWM signal generating section 6 to the driving section 8.

With the processing above, when an operation is performed in the operating section 14 so as to set the output sound volume from the loud speaker 12 to zero, it is possible to handle the case where a digital audio signal at a non-silent level, which has been inputted into the digital filter 5 before the above operation is performed, is further inputted into the PWM signal generating section 6. That is, even if the digital audio signal being at a non-silent level, is inputted into the PWM signal generating section 6 after the operation, the silent PWM signal output section 7 outputs a PWM signal having the duty ratio of 50%. Therefore, it is possible to prevent a reproduction of an analogue audio signal from the loud speaker 12.

Next, an action of the digital amplifier relating to the present embodiments will be explained in the case where inputting of a digital audio signal or an input signal from the reproducing unit is stopped.

The silent signal determining section 4 determines whether or not there is a signal input from the reproducing unit 13.

Consequently, when it is determined that there is no signal input from the reproducing unit 13, the silent signal determining section 4 inputs a control signal to the silent PWM signal output section 7. The silent PWM signal output section 7 outputs a PWM signal having the duty ratio of 50% to the driving section 8 in response to the control signal. In this case, since an analogue audio signal is not reproduced from the loud speaker 12, the output sound volume from the loud speaker 12 becomes zero.

Alternatively, when it is determined that there is a signal input from the reproducing unit 13, the silent signal determining section 4 further determines whether or not the digital audio signal from the gain regulation section 2 is a digital audio signal at the silent level. Specifically, the silent signal determining section 4 determines that the digital audio signal is at a silent level (i.e., inputting of the digital audio signal from the reproducing unit 13 is stopped), in the following condition: a digital audio signal within the range as described above (i.e., a digital audio signal indicating a value within a range from 0x00000F to 0xFFFFF0) is inputted from the gain regulation section 2, for the aforementioned period of time T, which is determined according to the sampling frequency of the digital audio signal.

As a result, when it is determined that the digital audio signal is at a silent level, the silent signal determining section 4 inputs a control signal into the silent PWM signal output section 7. The silent PWM signal output section 7 outputs a PWM signal having a duty ratio of 50% to the driving section 8 in response to the control signal. In this case, an analogue signal is not reproduced from the loud speaker 12, and thus the output sound volume from the loud speaker 12 becomes zero.

Alternatively, when it is determined that the digital audio signal from the gain regulation section 2 is not at the silent level, a control signal is not outputted from the silent signal determining section 4. Therefore, the silent PWM signal output section 7 outputs to the driving section 8 the PWM signal from the PWM signal generating section 6. In this case, an analogue audio signal is reproduced from the loud speaker 12.

According to the above processing, when inputting of the digital audio signal or an input signal from the reproducing unit 13 is stopped, the silent PWM signal output section 7 outputs a PWM signal having the duty ratio of 50%, even if the digital audio signal having been inputted before the stopping is subjected to a computing process by the digital filter 5 and then inputted in the PWM signal generating section 6. Therefore, it is possible to prevent a reproduction of an audio signal from the loud speaker 12.

As described above, according to the digital amplifier of the present invention, it is possible to prevent a reproduction of an analogue audio signal from the loud speaker, in both cases where an output sound volume of the loud speaker is set to zero, and where inputting of a digital audio signal or an input signal from the reproducing unit is stopped.

What is claimed is:

1. A digital amplifier comprising, a gain regulation means which regulates an gain for a digital audio signal, a PWM signal generating means which generates a PWM signal from said digital audio signal, said gain which has been regulated by said gain regulation means, a switching means which switches a switching power supply in response to said PWM signal generated by said PWM signal generating means, a detecting means which detects said gain which has been regulated by said gain regulation means, and a silent PWM signal outputting means which outputs to said switching means a PWM signal having a duty ratio of 50%, instead of said PWM signal which has been generated by said PWM signal generating means, when said detecting means detects that said gain is zero.

2. A digital amplifier comprising, a determining means which determines a digital audio signal as a silent signal, when the digital audio signal has a bit value within a predetermined range and is inputted for a predetermined period of time, a PWM signal generating means which generates a PWM signal from said digital audio signal, a switching means which switches a switching power supply in response to said PWM signal generated by said PWM signal generating means, and a silent PWM signal outputting means which outputs to said switching means a PWM signal having a duty ratio of 50%, instead of said PWM signal which has been generated by said PWM signal generating means, when said determining means determines that said digital audio signal is the silent signal.

3. An digital amplifier comprising, an input signal determining means which determines whether or not an input signal from a reproducing unit exists, a PWM signal generating means which generates a PWM signal from a digital audio signal included in said input signal, a switching means which switches a switching power supply in response to said PWM signal generated by said PWM signal generating means, and a silent PWM signal outputting means which outputs to said switching means a PWM signal having a duty ratio of 50%, instead of said PWM signal which has been generated by said PWM signal generating means, when said input signal determining means determines that said input signal from said reproducing unit is stopped.

* * * * *